United States Patent
Choi et al.

(10) Patent No.: US 8,261,617 B2
(45) Date of Patent: Sep. 11, 2012

(54) MICRO PIEZORESISTIVE PRESSURE SENSOR AND MANUFACTURING METHOD THEREOF

(75) Inventors: Chang Auck Choi, Daejeon (KR); Chang Han Je, Daejeon (KR); Gunn Hwang, Seoul (KR); Youn Tae Kim, Daejeon (KR); Sung Hae Jung, Daegu (KR); Myung Lae Lee, Daejeon (KR); Sung Sik Lee, Miryang (KR); Seok Hwan Moon, Daejeon (KR)

(73) Assignee: Electronics and Telecomunications Research Institute, Daejeon (KR)

( * ) Notice: Subject to any disclaimer, the term of this patent is extended or adjusted under 35 U.S.C. 154(b) by 67 days.

(21) Appl. No.: 12/745,745

(22) PCT Filed: Apr. 21, 2008

(86) PCT No.: PCT/KR2008/002233
§ 371 (c)(1),
(2), (4) Date: Jun. 2, 2010

(87) PCT Pub. No.: WO2009/072704
PCT Pub. Date: Jun. 11, 2009

(65) Prior Publication Data
US 2010/0251826 A1    Oct. 7, 2010

(30) Foreign Application Priority Data
Dec. 5, 2007   (KR) .................. 10-2007-0125467

(51) Int. Cl.
*G01L 9/06* (2006.01)
*B23P 17/04* (2006.01)
(52) U.S. Cl. ............... 73/721; 73/754; 29/592
(58) Field of Classification Search ........... 73/700-756
See application file for complete search history.

(56) References Cited

U.S. PATENT DOCUMENTS

| | | | | |
|---|---|---|---|---|
| 4,651,120 | A | * | 3/1987 | Aagard ............... 338/4 |
| 5,242,863 | A | * | 9/1993 | Xiang-Zheng et al. ..... 438/53 |
| 6,006,607 | A | * | 12/1999 | Bryzek et al. ........... 73/727 |

(Continued)

FOREIGN PATENT DOCUMENTS

DE    4024780 A1 * 10/1991

(Continued)

OTHER PUBLICATIONS

Hsin-Nan Chiang et al., "Investigation of the Hysteresis Phenomenon of a Silicon-based Piezoresistive Pressure Sensor," IEEE 2007 IMPACT, Oct. 2007, pp. 165-168.

(Continued)

*Primary Examiner* — Andre Allen

(57) ABSTRACT

A micro semiconductor-type pressure sensor and a manufacturing method thereof are provided. The micro semiconductor-type pressure sensor is implemented by etching a cavity-formation region of a substrate to form a plurality of trenches, oxidizing the plurality of trenches through a thermal oxidation process to form a cavity-formation oxide layer, forming a membrane-formation material layer on upper portions of the cavity-formation oxide layer and the substrate, forming a plurality of etching holes in the membrane-formation material layer, removing the cavity-formation oxide layer through the plurality of etching holes to form a cavity buried in the substrate, forming a membrane reinforcing layer on an upper portion of the membrane-formation material layer to form a membrane for closing the cavity, and forming sensitive films made of a piezoresisive material on an upper portion of the membrane.

22 Claims, 14 Drawing Sheets

U.S. PATENT DOCUMENTS

| | | |
|---|---|---|
| 6,910,383 B2 | 6/2005 | Ou et al. |
| 7,265,429 B2 | 9/2007 | Wan |
| 7,546,772 B2 * | 6/2009 | Cabuz et al. .............. 73/715 |
| 2002/0053242 A1 | 5/2002 | Tai et al. |
| 2005/0193827 A1 | 9/2005 | Fischer et al. |
| 2005/0252302 A1 * | 11/2005 | Muchow et al. ............ 73/754 |
| 2006/0081057 A1 | 4/2006 | Silverbrook et al. |
| 2007/0113658 A1 | 5/2007 | Combi et al. |
| 2007/0220986 A1 * | 9/2007 | Smith et al. .............. 73/727 |
| 2007/0277616 A1 * | 12/2007 | Nikkel et al. ............. 73/715 |
| 2009/0013792 A1 * | 1/2009 | Qiao et al. ................ 73/723 |

FOREIGN PATENT DOCUMENTS

| | | |
|---|---|---|
| JP | 2003-098025 A | 4/2003 |
| KR | 1020010057824 A | 7/2001 |
| KR | 1020030064534 A | 8/2003 |

OTHER PUBLICATIONS

Z. Dibi et al., "Effect of the Silicon Membrane Flatness Defect on the Piezoresistive Pressure Sensor Response," IEEE 2000 ICECS, Dec. 2000, pp. 853-856, vol. 2.

Thomas Lisec et al., "Surface Micromachined Piezoresistive Pressure Sensors with Step-Type Bent and Flat Membrane Structures," IEEE Transactions on Electron Devices, Sep. 1996, pp. 1547-1552, vol. 43, No. 9, IEEE.

G. Lammel et al., "Next Generation Pressure Sensors in Surface Micromachining Technology," Transducers'05, Jun. 5-9, 2005, Proceedings, pp. 35-36, IEEE.

Abhijeet V. Chavan et al., "A Monolithic Fully-Integrated Vacuum-Sealed CMOS Pressure Sensor," IEEE Transactions on Electron Devices, Jan. 2002, pp. 164-169, vol. 49, No. 1, IEEE.

Nima Chalichechian et al., "Piezo-resistor Pressure Sensor Cluster," University of Maryland, Final Project Report, Fall 2002.

International Search Report for PCT/KR2008/002233 filed Apr. 21, 2008.

Written Opinion of the International Searching Authority for PCT/KR2008/002233 filed Apr. 21, 2008.

\* cited by examiner

[Fig. 1]
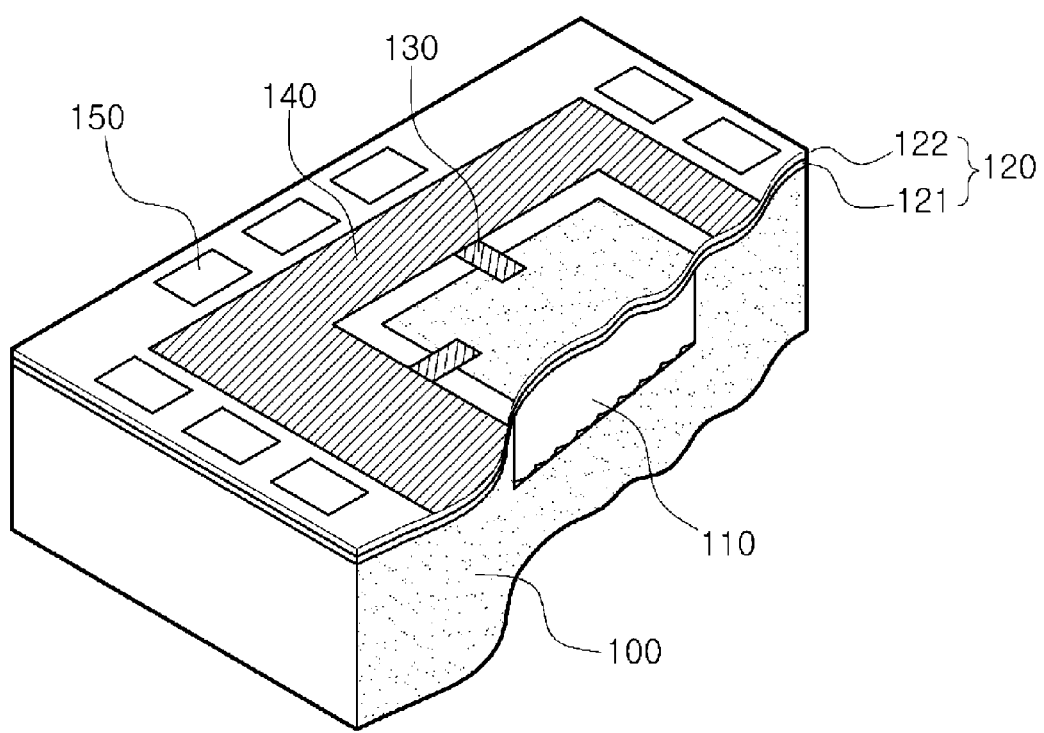

[Fig. 2]
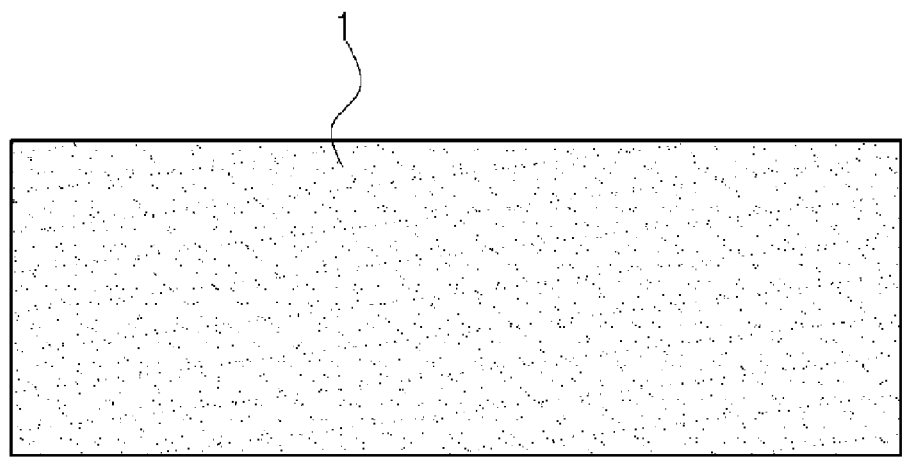

[Fig. 3]
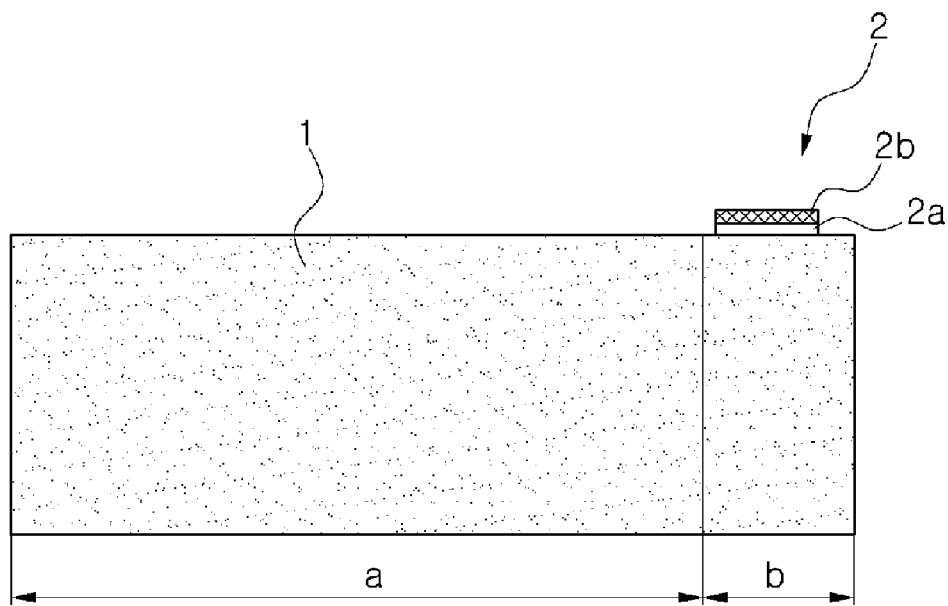

[Fig. 4]
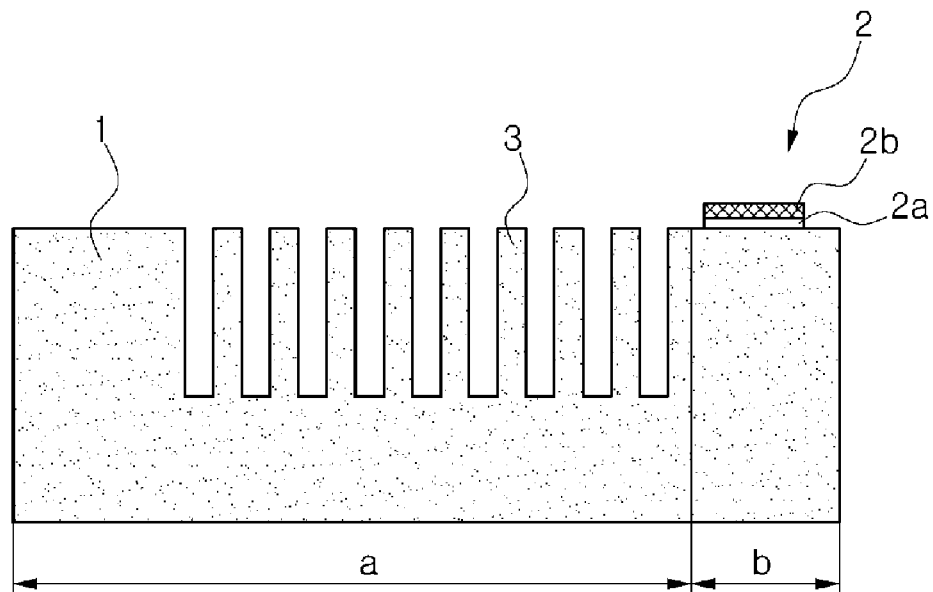
(a)
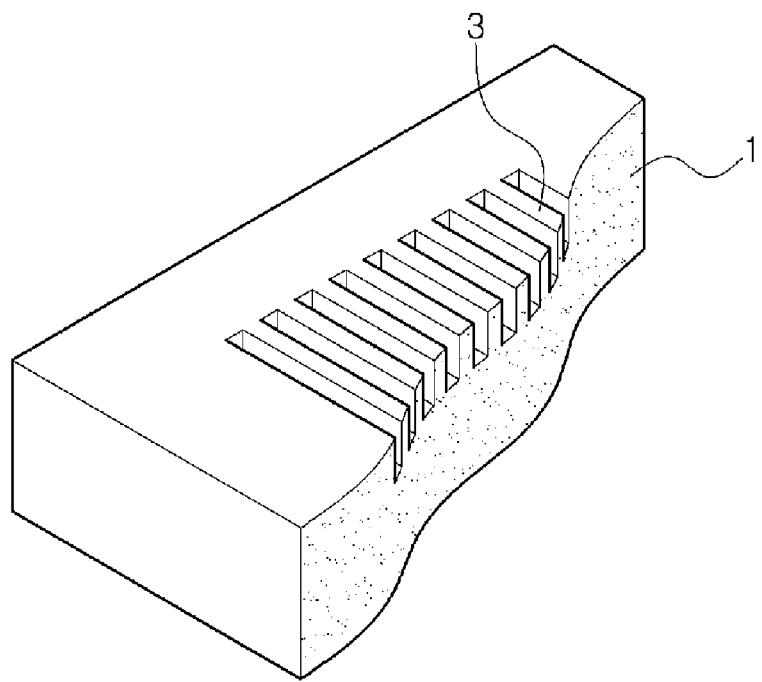
(b)

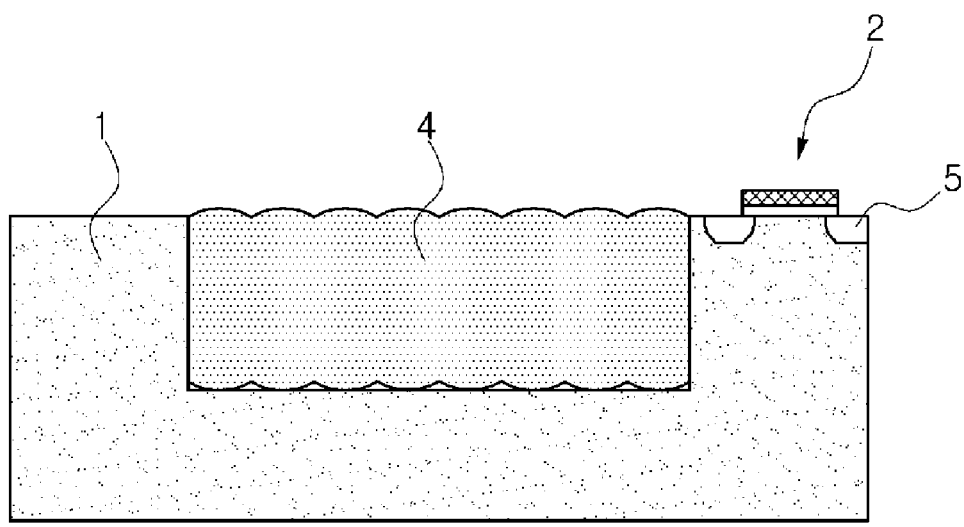
[Fig. 5]

[Fig. 6]
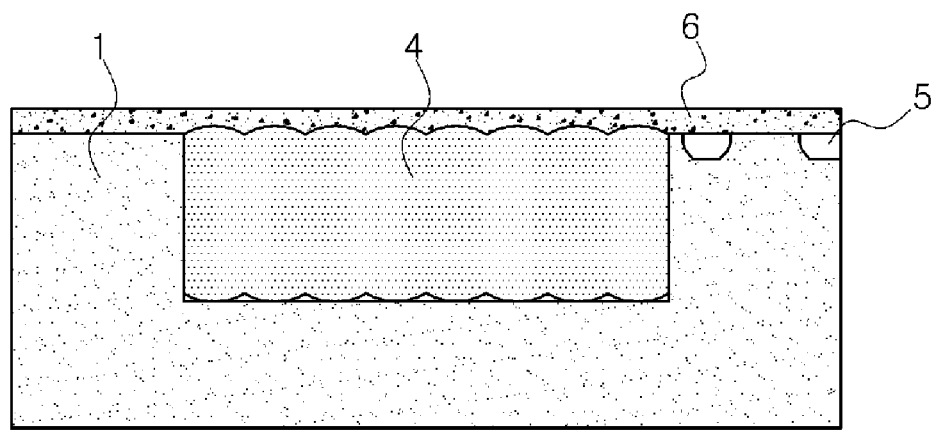

[Fig. 7]
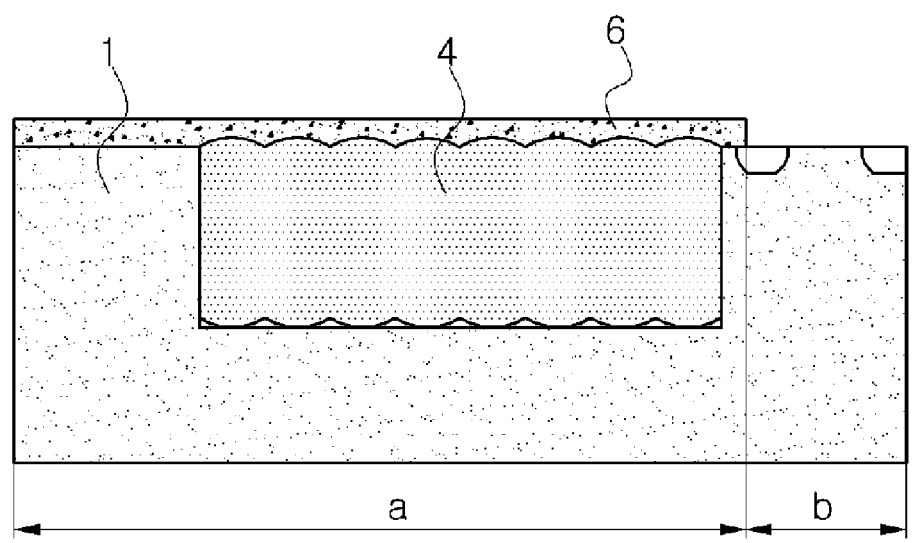

[Fig. 8]
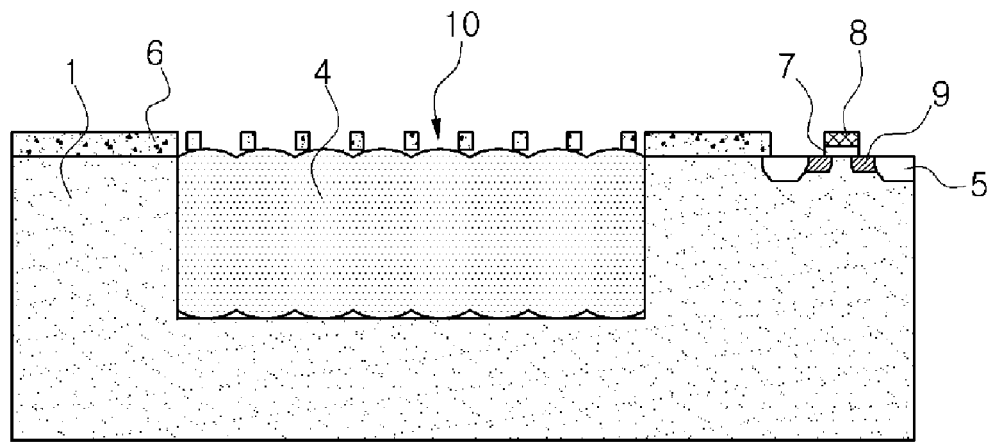
(a)
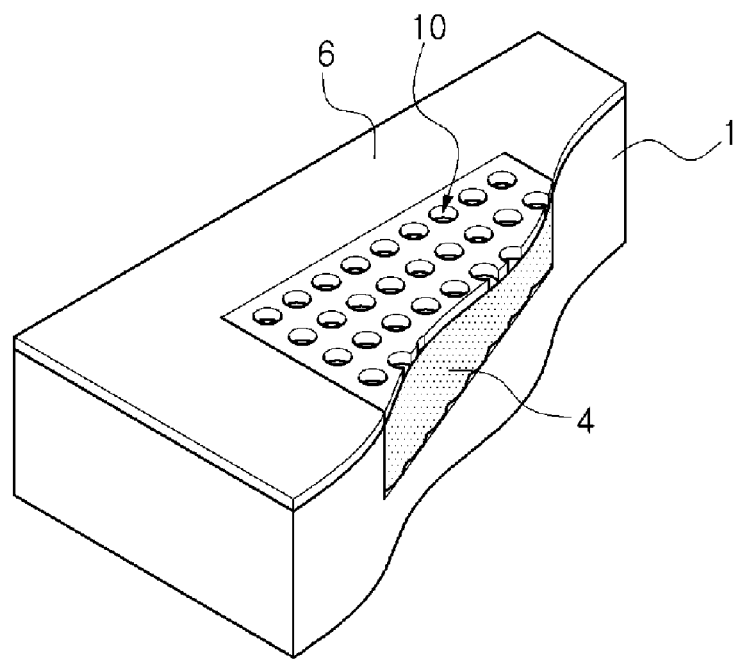
(b)

[Fig. 9]
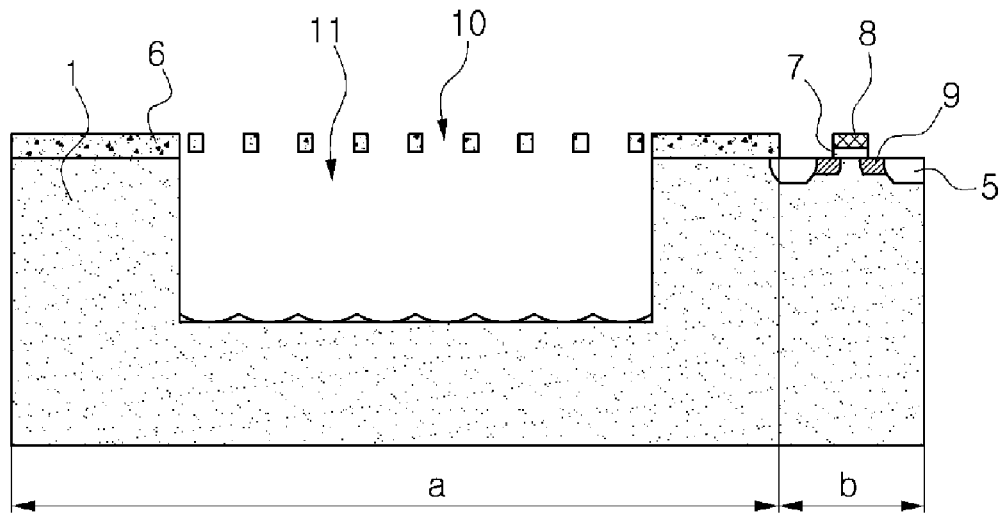
(a)
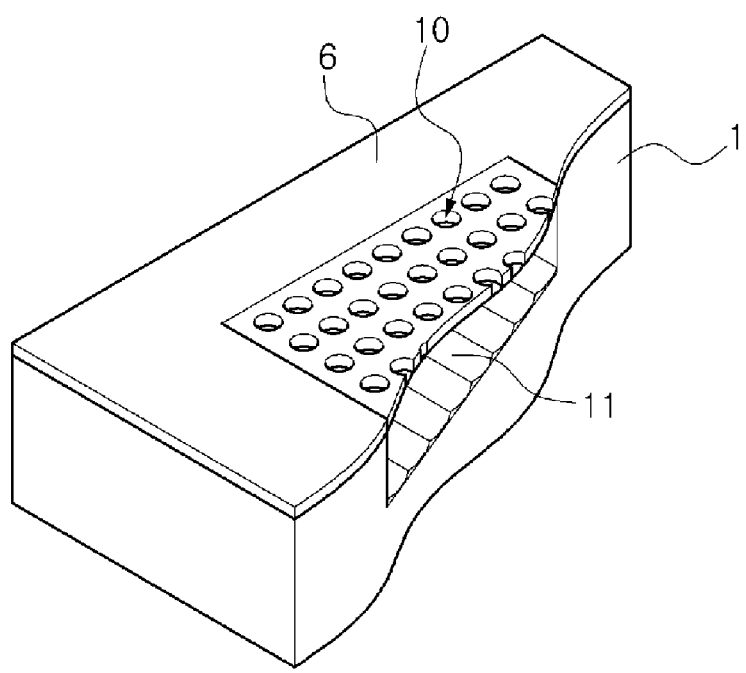
(b)

[Fig. 10]
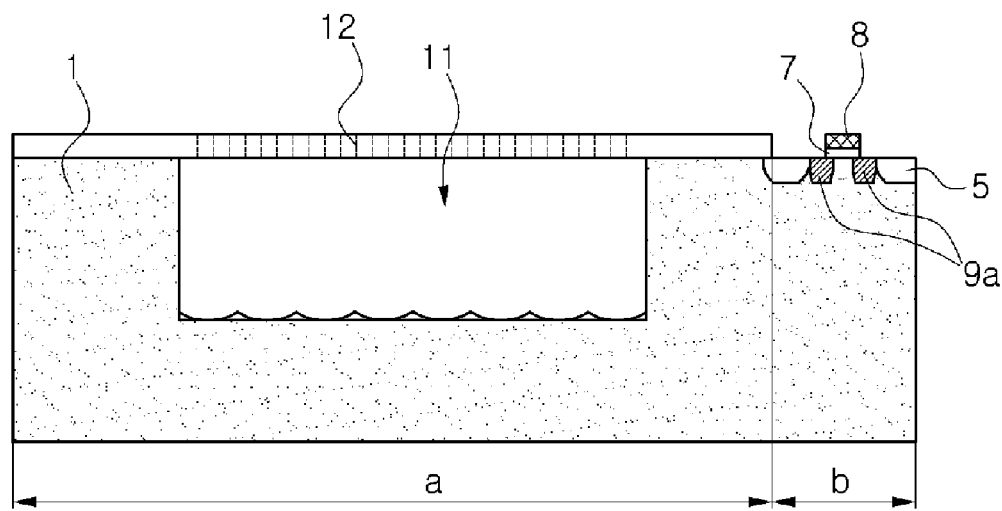

[Fig. 11]
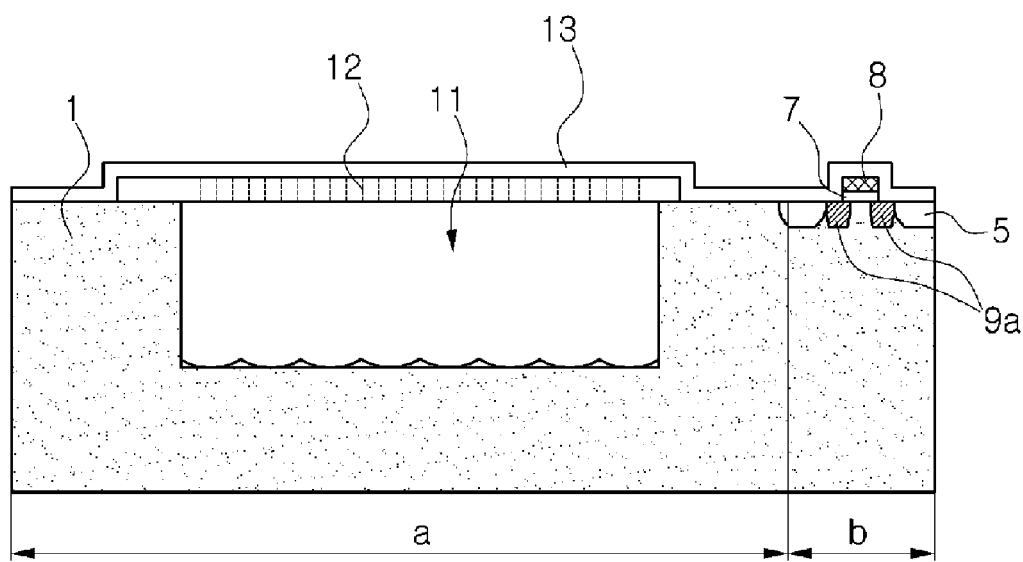

[Fig. 12]
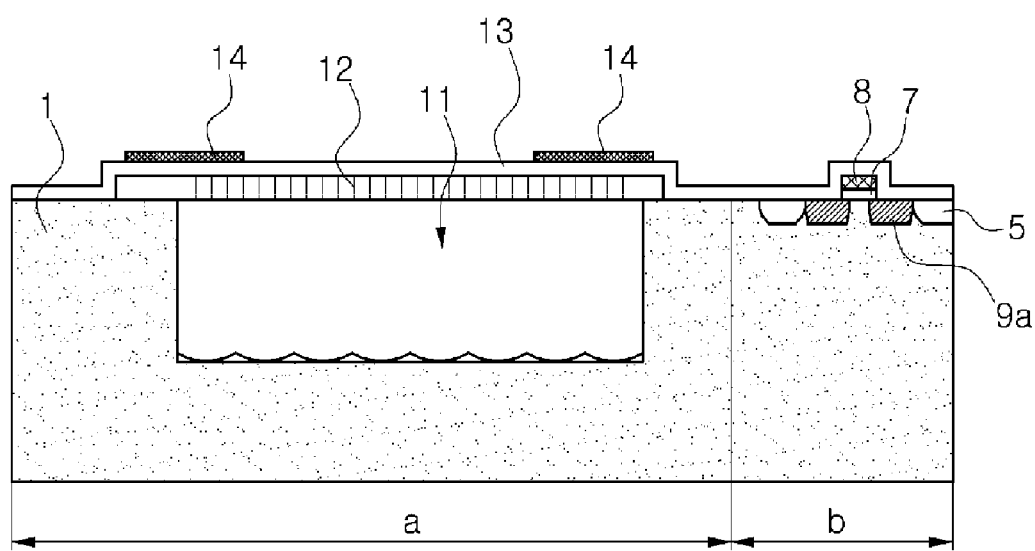

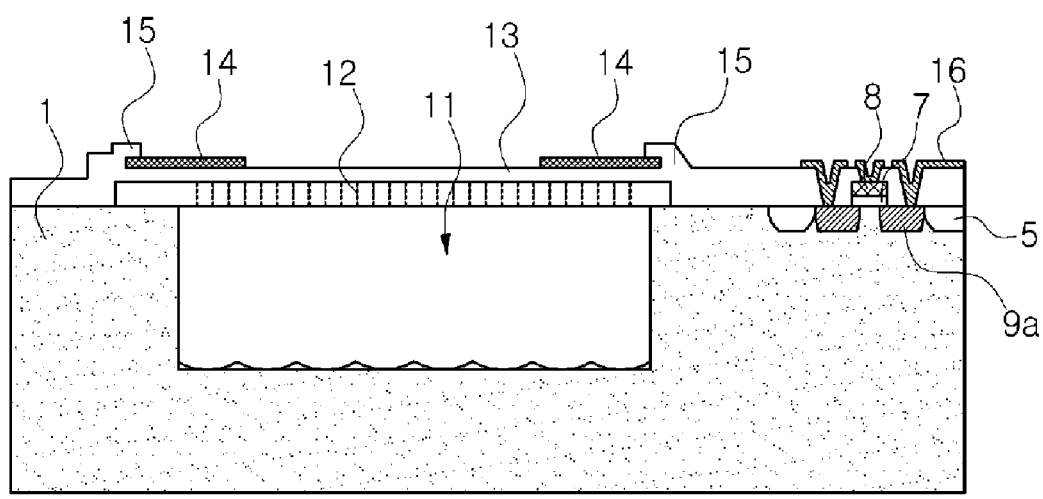
[Fig. 13]

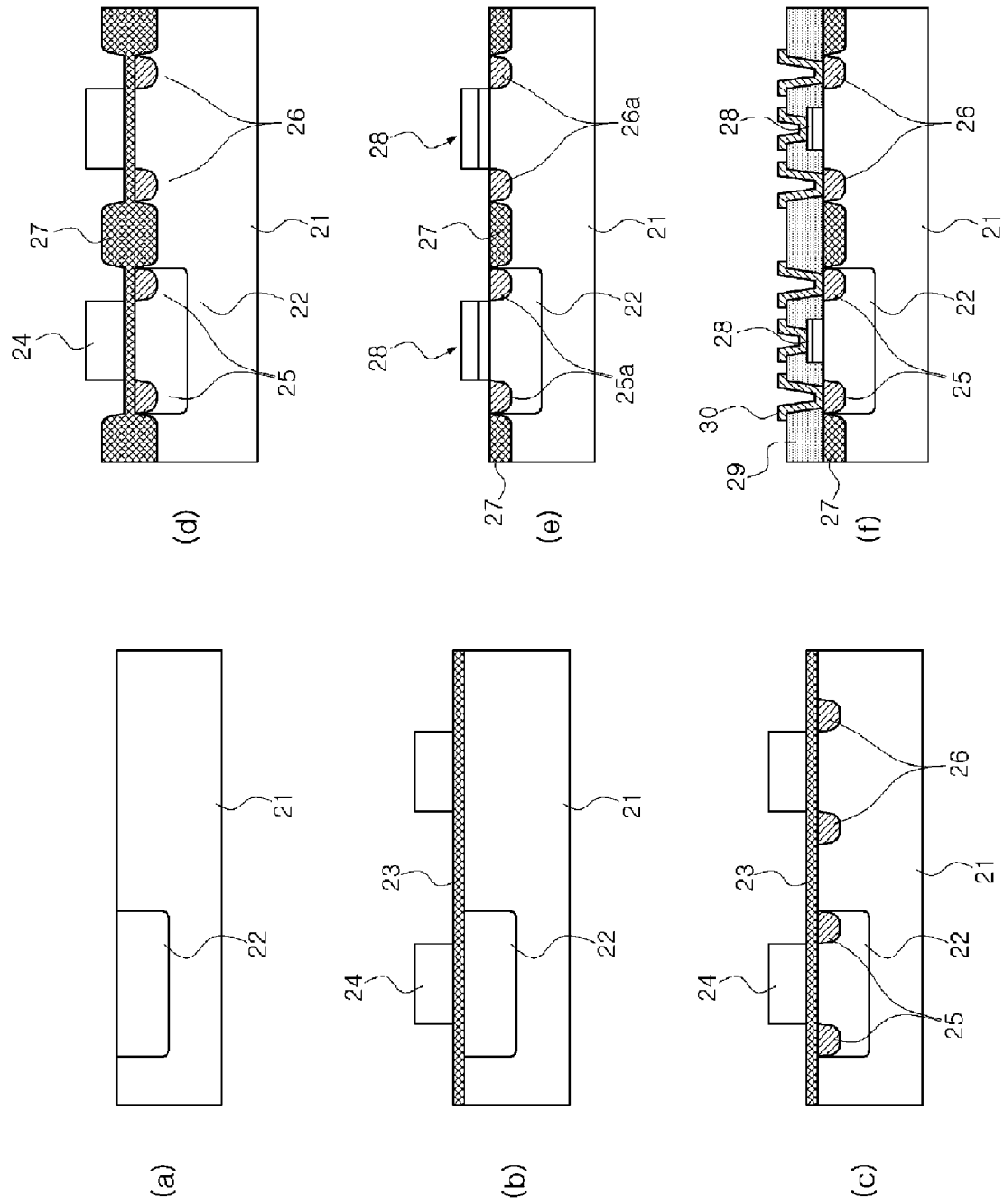
[Fig. 14]

MICRO PIEZORESISTIVE PRESSURE SENSOR AND MANUFACTURING METHOD THEREOF

TECHNICAL FIELD

The present invention relates to a piezoresisive pressure sensor, and more particularly, to a micro piezoresisive pressure sensor and a manufacturing method thereof, capable of implementing a pressure sensing structure having a closed cavity and a membrane and a semiconductor integrated circuit in a single substrate.

The present invention is derived from a research project supported by the IT R&D program of MIC/IITA [2006-S-054-02: Development of CMOS based MEMS Processed Multi-functional Sensor for Ubiquitous Environment]

BACKGROUND ART

A pressure sensor is a device for measuring a pressure of a gas or a liquid, and is widely used for various applications such as industrial measurement, medical treatment, vehicle engine control, environmental control, and electronic appliance control.

The pressure sensor uses a displacement, a deformation, a magneto-thermal conductivity, or a frequency to measure the pressure. Recently, a micro pressure sensor manufactured by using a semiconductor technology has been popularized in terms of a small size, a low price, and a high performance.

The pressure sensors are mainly classified into a capacitive pressure sensor and a piezoresisive pressure sensor. The capacitive pressure sensor has a low temperature coefficient and low power consumption. However, capacitive pressure sensor requires a wide device area and a complicated signal processor since a capacitance is used as an output signal. The piezoresisive pressure sensor has an excellent linearity and easiness of signal processing. However, the piezoresisive pressure sensor has a low sensitivity and a large dependency on temperature. Therefore, the capacitive pressure sensor and the piezoresisive pressure sensor are selectively used according to characteristics of applications.

In the piezoresisive pressure sensor, a membrane having a closed structure is deformed by an external force, so that stress of a resistive material such as polysilicon or a piezoelectric transducer (PLT) formed on the membrane leads to a change in resistance. The pressure is measured from the change in resistance.

A conventional piezoresisive pressure sensor is manufactured by using a bulk (silicon) micromachining method and a hetero-substrate attaching method. More specifically, the piezoresisive pressure sensor is manufactured by attaching a first substrate having a membrane through the bulk micromachining for the substrates and a second substrate having a closed cavity formed on an upper or lower portion of the membrane. Typically, the first substrate is made of a silicon material, and the second substrate is made of a pyrex glass material.

DISCLOSURE OF INVENTION

Technical Problem

As described above, two hetero substrates are needed for implementing the conventional piezoresisive pressure sensor. In addition, the conventional piezoresisive pressure sensor has a structure in which sensors and circuits for processing signals cannot be easily integrated into a single substrate. Therefore, an improvement is required for implementing a small-sized piezoresisive pressure sensor in one chip.

In order to solve the aforementioned problems, the present invention provides a micro semiconductor-type pressure sensor capable of being easily manufactured to have a pressure sensing structure having a closed cavity in a single semiconductor substrate and capable of having an excellent compatibility to a CMOS device manufacturing process so as for circuits to be integrated together with the pressure sensing structure into the same substrate in one chip and a manufacturing method thereof.

Technical Solution

According to an aspect of the present invention, there is provided a micro piezoresisive pressure sensor comprising: a silicon substrate; a cavity buried in the silicon substrate; a membrane which has a laminated structure formed on an upper portion of the silicon substrate to close the cavity; and sensitive films which are constructed with a piezoresisive material formed on an upper portion of the membrane.

In the above aspect, the micro piezoresisive pressure sensor may further comprise one or more semiconductor integrated devices which are formed in portions of the silicon substrate excluding a portion where the cavity is formed. In addition, the semi-conductor integrated device may be a CMOS device.

In addition, the cavity and the membrane may be formed together by using a CMOS device manufacturing process for manufacturing the semiconductor integrated device. In addition, the cavity may be formed through a trench etching process, a field oxide layer forming process for device isolation, and a silicon oxide removing process in the CMOS device manufacturing process. In addition, the membrane may be formed with a laminated structure of a polysilicon layer and a silicon oxide layer. In addition, the membrane may be formed through a diffusing thermal treatment process for source and drain and a silicon oxide layer forming process for insulation in the CMOS device manufacturing process.

According to another aspect of the present invention, there is provided a method of manufacturing a micro piezoresisive pressure sensor, comprising: forming a plurality of trenches by etching a cavity-formation region of a substrate; forming a cavity-formation oxide layer in the cavity-formation region of the substrate by oxidizing the plurality of trenches through a thermal oxidation process; forming a membrane-formation material layer on upper portions of the cavity-formation oxide layer and the substrate; forming a plurality of etching holes in the membrane-formation material layer formed on the cavity-formation oxide layer; forming a cavity buried in the substrate by removing the cavity-formation oxide layer through the plurality of etching holes; forming a membrane reinforcing layer on an upper portion of the membrane-formation material layer and forming a membrane for closing the cavity; and forming sensitive films which are constructed with a piezoresisive material on an upper portion of the membrane.

In the above aspect, the substrate may be made of a silicon material.

In addition, the method may further comprises forming a stress buffer layer in a device region for forming a semiconductor integrated device in the substrate, before the forming of the plurality of trenches, so as to protect the device region of the substrate where the semiconductor integrated devices are formed.

In addition, the method may further comprise forming a field oxide layer for device isolation between the semiconductor integrated devices in the device region of the substrate.

In addition, the cavity-formation oxide layer and the field oxide layer may be formed together in the same thermal oxidation process.

In addition, a width of the trenches is 2 μm or less, and an interval between the trenches is 0.56 to 0.60 times the width of the trenches. Accordingly, volumes of the plurality of trenches are expanded through the thermal oxidation process so as to fill empty spaces.

After the forming of the cavity-formation oxide layer and the field oxide layer, the stress buffer layer formed in the device region is removed. After the removing of the stress buffer layer, a gate, a source, and a drain for forming semiconductor integrated devices between field oxide layers are formed.

In addition, after the forming of the cavity buried in the substrate, a diameter of the plurality of etching holes may be reduced through volume expansion due to partial oxidation of the membrane-formation material layer by performing thermal oxidation on the membrane-formation material layer formed in the plurality of etching holes. In addition, the thermal oxidation of the membrane-formation material layer may be performed by using a diffusing thermal treatment process for the source and the drain.

In addition, the insulating layer and the membrane reinforcing layer may be formed together by using the same material through the same process.

In addition, the method may further comprise forming a chip-protection oxide layer, opening a portion of the chip-protection oxide layer, and forming metal layers for electrical connection between the sensitive films and the semiconductor integrated devices, after the forming of the insulating layer and the sensitive films.

Advantageous Effects

According to the present invention, it is possible to form a pressure sensing structure having a closed cavity, a membrane, and sensitive films in a single silicon substrate. In addition, it is possible to form a semiconductor integrated circuit for processing sensing signals together with the pressure sensing structure in the silicon substrate in one chip. As a result, it is possible to simplify complicated manufacturing processes of a conventional hetero-substrate attaching method and to overcome difficulty in integrating sensors and circuits. In addition, it is possible to greatly reduce a production cost.

In addition, the micro piezoresisive pressure sensor according to the present invention has an excellent compatibility to a CMOS device manufacturing process. Accordingly, it is possible to implement mass production thereof by using an existing CMOS device manufacturing process line. In addition, the micro piezoresisive pressure sensor according to the present invention can adjust the range of use range thereof according to a thickness of a deposited membrane for the closed cavity in a manufacturing process.

BRIEF DESCRIPTION OF THE DRAWINGS

FIG. 1 is a perspective view illustrating a structure of a micro piezoresisive pressure sensor according to an embodiment of the present invention.

FIGS. 2 to 13 are views illustrating processes of a method of manufacturing a micro piezoresisive pressure sensor according to an embodiment of the present invention.

FIG. 14 is a view illustrating an example of processes of a method of manufacturing a CMOS device.

BEST MODE FOR CARRYING OUT THE INVENTION

Hereinafter, embodiments of the present invention will be described in detail with reference to the accompanying drawings so that the ordinarily skilled in the art can easily implement the embodiments. However, in the detailed description of operational principles of the embodiments of the present invention, detailed description of well-known construction and operations will be omitted for clarifying the present invention.

In addition, in the drawings, elements having similar functions and operations are denoted by the same reference numerals.

FIG. 1 is a perspective view illustrating a structure of a micro piezoresisive pressure sensor according to an embodiment of the present invention.

Referring to FIG. 1, the micro piezoresisive pressure sensor includes a silicon substrate 100, a cavity 110 formed to be buried in the silicon substrate 100, a membrane 120 which is constructed with a laminated structure of multiple layers 121 and 122 formed on an upper portion of the silicon substrate 100 to close the cavity 110, sensitive films 130 constructed with a piezoresisive material on an upper portion of the membrane 120, one or more semiconductor integrated devices 140 formed on portions of the silicon substrate 100 excluding a portion where the cavity is formed, and electrode pads 150 electrically connected to the sensitive films 130 and the one or more semiconductor integrated devices 140.

The semiconductor integrated device 140 is constructed with a CMOS device. The cavity 110 and the membrane 120 are formed together in a CMOS device manufacturing process for manufacturing the semiconductor integrated device 140.

More specifically, the cavity 110 is formed through a trench etching process, a field oxide layer forming process for device isolation, and a silicon oxide removing process in the CMOS device manufacturing process. The membrane 120 is formed with a laminated structure of the polysilicon layer 121 and the silicon oxide layer 122 which are formed through a diffusing thermal treatment process for source and drain and a silicon oxide layer forming process for insulation in the CMOS device manufacturing process.

For the micro piezoresisive pressure sensor having the aforementioned structure, a semiconductor integrated device and a pressure sensing structure may be implemented in a single substrate by using the CMOS device manufacturing process. As a result, the micro piezoresisive pressure sensor can be implemented in a one-chip including sensing circuits.

Now, a method of manufacturing a micro piezoresisive pressure sensor according to an embodiment of the present invention will be described with reference to the accompanying drawings.

FIGS. 2 to 13 are views illustrating processes of the method of manufacturing a micro piezoresisive pressure sensor according to the embodiment of the present invention. FIG. 14 is a view illustrating an example of processes of a method of manufacturing a CMOS device.

As described above, the micro piezoresisive pressure sensor according to the present invention may be implemented by using a general CMOS device manufacturing process. In summary, a surface machining process and an oxide layer growing process are performed on a silicon substrate, so that a closed cavity buried in the substrate and a membrane can be formed together. In addition, sensing patterns and semiconductor integrated circuits are implemented at the same time on the surface of the same substrate through the aforementioned CMOS device manufacturing process. In addition, in the micro piezoresisive pressure sensor according to the present invention, the pressure sensing structure and the semiconductor integrated device may be formed together. Alternatively, only the pressure sensing structure may be formed. In a case where only the pressure sensing structure is formed, the processes for forming the semiconductor integrated device may be omitted. Therefore, in the following embodiments, the case where the pressure sensing structure and the semiconductor integrated device are formed together will be exemplified.

For the better understanding of the method of manufacturing a micro piezoresisive pressure sensor according to the present invention, a CMOS device manufacturing process will be described in brief with reference to FIG. 14.

Referring to FIG. 14, as shown in (a), an N-well or a P-well 22 is formed by diffusing n-type dopants or p-type dopants on a silicon substrate 21. The N-well or P-well forming process may be omitted according to a type of the silicon substrate, that is, a P type or an N type thereof. Then, as shown in (b), a silicon oxide layer 23 is grown on an upper portion of the substrate 21 through an oxidation process so as to protect a silicon interface. Then, a silicon nitride layer 24 is formed on the silicon oxide layer 23 through a low pressure chemical vapor deposition (LPCVD) process.

Then, as shown in (c), source and drain doping regions 25 and 26 are formed by implanting dopant ions (that is, N+ ions and P+ ions) by using the silicon nitride layer 24 as an ion implantation barrier.

Then, as shown in (d), the silicon oxide layer 23 is grown into a thick oxide layer through a long-time oxidation process so as to form a field oxide layer 27 for device isolation.

Then, as shown in (e), the nitride layer 24 and the interface-protection silicon oxide layer 23 are removed, and a gate oxide layer for forming a channel region is grown. Then, polysilicon is deposited on the gate oxide layer so as to form a gate 28. In addition, the dopant ions implanted into the source and drain doping regions 25 and 26 are diffused down to a desired depth so as to form a source 25a and a drain 26a.

Finally, as shown in (f), a chip-protection oxide layer 29 is formed on an upper portion of the source 25a, the drain 26a, the gate 28, and the substrate 21. Then, the oxide layer 29 is selectively patterned so as to form metal layers 30 for electrical connection.

Then, the method of manufacturing a micro piezoresisive pressure sensor by using the CMOS device manufacturing process according to the embodiment of the present invention will be described.

Firstly, as shown in FIG. 2, a substrate 1 in which a pressure sensing structure and a semiconductor integrated device are to be formed is prepared. The substrate 1 is made of a silicon material. As shown in FIG. 3, in the substrate 1, a sensor region 'a' in which the pressure sensing structure is to be formed and a device region 'b' in which the semi-conductor integrated circuit is to be formed are defined.

As shown in FIG. 4, in the substrate 1, a stress buffer layer 2 is formed on the device region 'b' so as to protect the device region 'b' from a high-temperature environment at the time of forming the pressure sensing structure. The stress buffer layer 2 is constructed with a laminated structure of multiple layers, for example, a silicon oxide layer 2a and a silicon nitride layer 2b. More specifically, the silicon oxide layer 2a and the silicon nitride layer 2b having predetermined thicknesses are deposited on the silicon substrate 1. Then, the silicon oxide layer and the silicon nitride layer in a region excluding the device region 'b' are removed through a photolithography process, so that the stress buffer layer 2 is formed. At this time, methods of depositing the silicon oxide layer 2a and the silicon nitride layer 2b are a thermal oxide layer growing method using a furnace and an LPCVD method, respectively.

Preferably, the stress buffer layer 2 is formed before a process for forming the cavity.

Then, the cavity is formed in the sensor region 'a' of the substrate 1. More specifically, as shown in FIG. 4, a plurality of trenches 3 are formed by etching a portion of the sensor region 'a' of the silicon substrate 1 where the cavity is to be formed. As the etching process, a photolithography and a deep RIE process may be used.

The plurality of trenches 3 are formed with predetermined width and interval in the portion of the sensor region 'a' where the cavity is to be formed. The width of the trenches 3 is preferably about 2 μm or less. The interval of the trenches 3 is preferably 0.56 to 0.6 times the width of the trenches 3. The reason for designing the width of the trenches 3 to be 2 μm or less is as follows. In a general thermal oxide layer process, it takes about 6 to 7 hours to grow a silicon oxide down to a depth of about 1 μm from a surface the a silicon substrate. Therefore, if a deeper silicon oxide tries to be formed, a growing time may be greatly increased by a geometrical progression, which is not practical. In addition, the reason for designing the interval of the trenches 3 to be 0.56 to 0.6 times the width of the trenches 3 is as follows. By selecting the dimension of width of the trenches 3, the gaps between the trenches 3 can be filled due to volume expansion of the silicon oxide resulting from sufficient oxidation thereof in the oxidation process. For example, in a case where the width of the trenches 3 is 1.6 μm, the interval of the trenches 3 is maintained to be in a range of about 0.9 to 1.0 μm. A depth of the trenches 3 is selected according to a size of the to-be-formed cavity.

In addition, as shown in FIG. 4, a shape of the trenches 3 may be a bar pattern or an isolated pattern with a periodic interval.

After the plurality of trenches 3 are formed, the trenches 3 are grown into a silicon oxide through a thermal oxidation process. Due to the thermal oxidation process, as shown in FIG. 5, the trenches 3 are grown into the silicon oxide 4, so that the gaps between the trenches are filled by the volume expansion of the grown silicon oxide 4.

The thermal oxidation of the trenches 3 may be performed by using a process for forming a magnetic-field oxide for device isolation in the CMOS device manufacturing process.

That is, the thermal oxidation process is performed on the silicon substrate 1 in which the stress buffer layer 2 is formed on the device region 'b' and the plurality of trenches 3 are formed on the sensor region 'a', so that the silicon oxide is grown on the trenches 3 and a portion of the device region 'b' where the stress buffer layer 2 is not formed. As a result, a cavity-formation oxide layer 4 for cavity formation and the field oxide layer 5 for device isolation are formed at the same time. Since the cavity-formation oxide layer 4 and the field oxide layer 5 can be formed by performing one-time thermal oxidation process, it is possible to reduce a production time for the integrated-MEMS-type piezoresisive pressure sensor where the semiconductor integrated circuit is integrally formed.

After the formation of the cavity-formation oxide layer 4 and the field oxide layer 5, the stress buffer layer 2 formed on the device region 'b' is removed. The stress buffer layer 2 may be removed by using a general wet etching process. Alternatively, if a pre-determined surface flatness of the cavity-formation oxide layer 4 is needed, a surface polishing process such as a chemical mechanical polishing (CMP) process may be additionally performed.

Then, a membrane-formation material layer is formed on an upper portion of the sensor region 'a' of the substrate 1 where the cavity-formation oxide layer 4 and the field oxide layer 5 are formed as follows.

As shown in FIG. 6, a polysilicon layer 6 is formed with a predetermined thickness (for example, 1.5 to 3.0 μm) on an upper surface of the substrate 1. Then, as shown in FIG. 7, the polysilicon layer formed on the device region 'b' is removed through a lithography process and an etching process.

Then, as shown in FIG. 8, a gate oxide layer 7, a gate-poly 8, and source and drain doping regions 9 for formation of a semiconductor integrated device are formed on the device region 'b' exposed by removing the polysilicon layer 6. The gate oxide layer 7, the gate-poly 8, and the source and drain doping regions 9 can be formed by using a well-known CMOS device manufacturing process.

Then, as shown in FIG. 8, a plurality of etching holes 10 are formed on the polysilicon layer 6 so as to remove the cavity-formation oxide layer 4. The etching holes 10 are formed by using a photolithography process and a polysilicon etching process. A diameter of the etching holes 10 are designed so that the etching holes 10 can be substantially filled through volume expansion of silicon oxide in the polysilicon thermal oxidation process. For example, the diameter is in a range of 0.5 to 1.5 μm. In addition, an interval between the etching holes 10 and the number of etching holes 10 are not particularly limited. The interval and the number can be selected so that the cavity-formation oxide layer 4 can be wet-etched by injecting an etchant for the cavity-formation oxide through the etching holes 10 or so that the cavity-formation oxide layer 4 can be rapidly removed through a dry etching process such a gas phase etching (GPE) process using hydrogen fluoride (HF). However, it is preferable that the plurality of etching holes 10 are disposed with a constant interval in terms of process efficiency.

After the plurality of etching holes 10 are formed on the polysilicon layer 6, the etchant is injected through the etching holes 10 so as to remove the cavity-formation oxide layer 4. More specifically, in the state that the device region 'b' is protected by using a photoresist or the like, the cavity-formation oxide layer 4 is removed through an etching process using a large difference in etching ratio between the polysilicon layer and the silicon oxide layer such as an oxide-layer wet etching process using a hydro fluoric solution or a dry etching process, for example, a GPE process. In FIG. 9, pictures (a) and (b) illustrate a cross-section structure and a three-dimensional structure of the substrate 1 where the cavity-formation oxide layer 4 is removed, respectively. As shown in the pictures, while the cavity-formation oxide layer 4 is removed, the cavity 11 buried in the substrate 1 is formed.

After the cavity 11 is formed, the polysilicon layer 6 where the etching holes 10 are formed is oxidized, so that the diameter of the etching holes 10 can be reduced through the volume expansion of the polysilicon oxide. The polysilicon layer 6 can be oxidized through a drive-in process or an oxidation process for diffusing the source and drain doping regions 9 down to a required depth in the device region 'b' in the CMOS device manufacturing process. That is, during the oxidation process or the drive-in process for diffusing the source and drain doping regions 9 in the device region 'b', the polysilicon layer 6 around the etching holes 10 is also oxidized, so that the volume of the silicon oxide is expanded. Therefore, the diameter of the etching holes 10 is reduced. As a result, the cavity 11 is substantially closed by the partially-oxidized polysilicon layer 6. FIG. 10 illustrates a cross section of the substrate 1 where a membrane-formation material layer 12 is formed through the partial oxidation of the polysilicon layer 6.

In a case where the polysilicon layer 6 is partially oxidized under a process condition for diffusing the source and drain doping regions in the CMOS device manufacturing process, the etching holes 10 may not completely filled. According to the present invention, in order to reinforce the membrane 12, a reinforcing layer is formed on an upper portion of the membrane 12. The reinforcing layer may be constructed with an insulating layer such as a silicon nitride layer, a silicon oxide layer and the like. In addition, in the CMOS device manufacturing process, the reinforcing layer can be formed in a process for forming an insulating layer.

For example, as shown in FIG. 11, an oxide layer 13 is deposited on the entire region including the device region 'b' and the sensor region 'a', so that the reinforcing layer for the membrane-formation material layer 12 and the insulating layer for the device region 'b' can be formed at the same time.

The membrane for closing the cavity 11 buried in the substrate 1 is formed by using the insulating layer such as the membrane-formation material layer 12 and the oxide layer 13.

Then, sensitive films of the piezoresisive pressure sensor are formed on the sensor region 'a'. That is, as shown in FIG. 12, the sensitive films 14 of the piezoresisive pressure sensor is formed on the oxide layer 13 formed in an upper portion of the cavity 11. The sensitive films 14 are formed by depositing a piezoelectric thin film using a doped polysilicon or PGT as a piezoelectric material and performing patterning.

Finally, as shown in FIG. 13, a chip-protection oxide layer 15 is deposited on the entire upper surface of the substrate 1, and metal layers 16 for electrical connection to the semiconductor integrated circuits formed in the device region 'b' and the sensitive films 14 formed in the sensor region 'a' are formed. More specifically, the oxide layer 13 and the chip-protection oxide layer 15 are opened by performing a photolithography process and an etching process, and the metal layers 16 are deposited on the opened portions. Although not shown in FIG. 13, the electrode pads 150 of FIG. 1 are formed at the same time when the metal layers 16 are formed.

While the present invention has been particularly shown and described with reference to exemplary embodiments thereof, it will be understood by those skilled in the art that various changes in form and details may be made therein without departing from the spirit and scope of the present invention as defined by the appended claims.

The invention claimed is:

1. A micro piezoresistive pressure sensor comprising:
   a silicon substrate;
   a cavity formed in a sensor region of the silicon substrate;
   a membrane formed over the silicon substrate and configured to substantially enclose the cavity;
   a sensitive film, including piezoresistive material, formed over the membrane; and
   one or more semiconductor integrated devices which are formed in a device region of the silicon substrate,
   wherein the semiconductor integrated devices are complementary metal oxide semiconductor (CMOS) devices,
   wherein the membrane is coupled to the substrate in a CMOS process other than a bonding method, and
   wherein the membrane is coupled to the sensitive film in a CMOS process other than a bonding method.

2. The micro piezoresistive pressure sensor of claim 1, wherein the cavity and the membrane are formed together at substantially the same time by using a CMOS device manufacturing process for manufacturing the semiconductor integrated devices.

3. The micro piezoresistive pressure sensor of claim 2, wherein the cavity in the sensor region is formed by performing a CMOS process, the CMOS process including forming a trench in the silicon substrate, forming an oxide layer in the trench, and removing the oxide layer in the trench.

4. The micro piezoresistive pressure sensor of claim 2,
wherein the membrane comprises a laminated insulating layer, and
wherein the laminated insulating layer includes (i) a polysilicon layer, and (ii) any of a silicon nitride layer and a silicon oxide layer.

5. The micro piezoresistive pressure sensor of claim 4, wherein the membrane is formed using a CMOS process including a diffusing thermal treatment process and a silicon oxide layer forming process.

6. A method of manufacturing a micro piezoresistive pressure sensor, comprising:
forming a trench by etching a sensor region of a substrate;
forming a first oxide layer to fill the trench;
forming a first membrane layer over the first oxide layer and the substrate;
forming a plurality of etching holes in the first membrane layer;
removing the first oxide layer through the plurality of etching holes to form a cavity;
filling the etching holes to form a second membrane layer, the second membrane layer being disposed over the cavity and substantially enclosing the cavity; and
forming a piezoresistive film over the second membrane layer.

7. The method of claim 6, wherein the first membrane layer is coupled to the substrate using a CMOS process other than a bonding method, and
wherein the second membrane layer is coupled to the piezoresistive film using a CMOS process other than a bonding method.

8. The method of claim 7, the method further comprising forming a stress buffer layer in a device region of the substrate, before forming the trench.

9. The method of claim 8, the method further comprising:
forming semiconductor integrated devices in the device region of the substrate; and
forming a field oxide layer in the device region of the substrate,
wherein the semiconductor integrated devices are formed between neighboring field oxide layers in the device region.

10. The method of claim 9, wherein the first oxide layer in the sensor region and the field oxide layer in the device region are formed at substantially the same time using a thermal oxidation process.

11. The method of claim 10, wherein a width of the trench is 2 μm or less, and a width of an interval between neighboring trenches is 0.56 to 0.60 times the width of the trench.

12. The method of claim 9, the method further comprising removing the stress buffer layer formed in the device region through a wet etching process and performing a polishing process including a chemical mechanical polishing (CMP) process for surface planarization, after forming the first oxide layer and the field oxide layer.

13. The method of claim 12, the method further comprising forming a gate, a source, and a drain in the device region, after the step of removing the stress buffer layer.

14. The method of claim 12, the method further comprising filling the plurality of etching holes by performing thermal oxidation on the first membrane layer to form the second membrane layer.

15. The method of claim 14, wherein the first membrane layer is made of polysilicon.

16. The method of claim 15, wherein the step of removing the first oxide layer to form the cavity includes:
removing the first oxide layer using (i) an oxide-layer wet etching method employing a hydro fluoric solution, or (ii) an oxide-layer dry etching method utilizing an etch ratio difference between the polysilicon and the first oxide layer.

17. The method of claim 14, wherein the thermal oxidation of the first membrane layer in the sensor region is performed at substantially the same time as a diffusing thermal treatment process for the source and the drain in the device region.

18. The method of claim 17, wherein a diameter of the plurality of etching holes is in a range of 0.5 to 1.5 μm.

19. The method of claim 14, the method further comprising forming an insulating layer over the source, the drain, and the gate in the device region.

20. The method of claim 19, the method further comprising forming a membrane reinforcing layer over the second membrane layer,
wherein the step of forming the insulating layer in the device region and the step of forming the membrane reinforcing layer in the sensor region are performed at substantially the same time.

21. The method of claim 20, wherein each of the insulating layer and the membrane reinforcing layer are include a silicon oxide layer or a silicon nitride layer.

22. The method of claim 14, after the step of forming the insulating layer in the device region and forming the piezoresistive film, the method further comprising:
forming a chip-protection oxide layer over the insulating layer and the piezoresistive film;
opening a portion of the chip-protection oxide layer; and
forming metal layers configured to electrically couple the piezoresistive film and the semiconductor integrated devices.

* * * * *